(12) United States Patent
Wanlass

(10) Patent No.: US 6,339,550 B1
(45) Date of Patent: Jan. 15, 2002

(54) SOFT ERROR IMMUNE DYNAMIC RANDOM ACCESS MEMORY

(76) Inventor: Frank M. Wanlass, 2655 Keystone Ave., Apt. 4, Santa Clara, CA (US) 95051

( * ) Notice: Subject to any disclaimer, the term of this patent is extended or adjusted under 35 U.S.C. 154(b) by 0 days.

(21) Appl. No.: 09/222,369

(22) Filed: Dec. 29, 1998

(51) Int. Cl.[7] .............................................. G11C 16/04

(52) U.S. Cl. .................. 365/189.01; 365/149; 365/131

(58) Field of Search ........................... 365/189.01, 149, 365/131, 189.04

(56) References Cited

U.S. PATENT DOCUMENTS 5,969,996 A * 10/1999 Muranaka et al. ...... 365/189.01
6,151,242 A * 11/2000 Takashima .................. 365/145

* cited by examiner

*Primary Examiner*—Vu A. Le
*Assistant Examiner*—VanThu Nguyen

(57) ABSTRACT

An alpha particle striking the cell of a DRAM bit can destroy stored charge, resulting in a single bit soft error. A DRAM architecture is described that circumvents this problem by storing every DRAM bit redundantly in two cells. If a stored charge is represented by a logic 1, then when reading a DRAM bit, if either of it's cells is storing charge then the bit is a logic 1. Only if both cells of a bit have no charge is the bit a logic 0.

4 Claims, 2 Drawing Sheets

SOFT ERROR IMMUNE DYNAMIC RANDOM ACCESS MEMORY

BACKGROUND OF THE INVENTION

1. Field of the Invention

MOS dynamic random access memory arrays are susceptible to occasional single bit soft errors caused by random alpha particle radiation. This invention relates to an improved dynamic random access memory architecture that is completely immune to single bit soft errors.

2. Description of the Prior Art

Each single bit memory cell in a MOS dynamic random access memory (DRAM) is very simple, consisting of one transistor connected to one capacitor, where the amount of charge on the capacitor determines whether a 'one' or a 'zero' is stored in the cell. This memory cell is susceptible to having the charge on its capacitor destroyed if a random energetic alpha particle strikes the capacitor or a junction of its connecting transistor. When subsequently data is read from the cell it will be incorrect, causing a "soft error." The larger the DRAM memory the more likely it is to have one or more soft errors during any given period of time.

FIG. 1 shows a small portion of the core of a DRAM chip, where a capacitor Cb and a transistor Tb comprise the cell for one memory bit, and the diode Db represents the inherent junction between the source and body of Tb. Data for this bit is stored as a charge on the capacitor Cb; if logic 1 represents a charge on Cb then logic 0 will represent no charge. The access transistor Tb places charge from the bit line BL onto Cb during writing and extracts charge from Cb onto BL during reading. The word line WL turns Tb on or off at the appropriate times.

When Tb places a charge from Cb onto BL, the voltage change of BL will be smaller than a full logic swing, because the stray capacitance of the bit line BL is significantly larger than the capacitance Cb. However, it is possible to design a sense amplifier to detect this small voltage change if the amplifier is made differential, by adding another reference bit line input BLR. As shown in FIG. 1, BLR is connected to a reference capacitor Cr through a reference transistor Tr, whose gate is driven by the reference word line WLR. Cr is made equal to Cb, and before Cr is connected to BLR it is charged to a reference voltage Vr by transistor Tp3, where Vr is less than the logic 1 voltage written onto Cb, but greater than 0. For example, if Cb is initially charged to Vp, when writing a logic 1, and since junction leakage will over time reduce the voltage on Cb, it would be appropriate to set Vr~Vp/4. So that later, when transistors Tb and Tr are turned on at the same time, there will be a positive or a negative differential signal on the bit line pair BL and BLR, depending on whether the voltage remaining on Cb is higher or lower than Vp/4 respectively. After detecting the polarity of this signal the sense amplifier will charge Cb either to a full voltage of Vp or to 0.

A bit in a DRAM chip can either be read from or written to. In either case, first a whole row of memory cells connected to a word line WL is read, then refreshed. Next after refreshing, and if in a read cycle, the data from a selected bit on the row of cells is transferred to an output on the chip, or if in a write cycle, the data from this selected bit is overwritten by new data from an input on the chip.

There are three phases in a DRAM memory cycle, Precharge, Sense, and Refresh/Read/Write:

During Precharge φp goes high enabling bit lines BL and BLR to be charged to the same potential Vp through transistors Tp1 and Tp2, and the capacitor Cr to be charged to a reference voltage Vr through transistor Tp3.

During Sense the word lines WL and WLR simultaneously go high turning on transistors Tb and Tr which connect capacitors Cb and Cr to BL and BLR respectively. The sense amplifier determines whether the charge on Cb is more or less than the reference charge on Cr, by determining the differential voltage between BL and BLR.

During Refresh/Read/Write, while WL and WLR are still high, if the sense amplifier had sensed the voltage on BL (VBL) to be larger than the voltage on BLR (VBLR) it will write a full charge back into Cb, and if it had sensed VBL to be smaller than VBLR it will write 0 charge back into Cb. If this is a read cycle the output of the sense amplifier will be sent to chip a output, and if this is a write cycle the sense amplifier will write new data into Cb from a chip input.

The capacitance Cb can be either a dielectric capacitor or a PN junction capacitor. If Cb is a PN junction then it will be reverse biased when charge is stored on it. This reverse bias will cause a depletion region across the junction. An energetic alpha particle striking the depletion region will cause a momentary short across the depletion region, which will drain the charge from Cb resulting in a soft error. If Cb is a dielectric capacitor, it will be impervious to alpha particles. However, there still is an inherent junction from the source of transistor Tb to ground represented by the diode Db. This junction will be reverse biased with a depletion region when a charge is stored on Cb. This Db depletion region can be momentarily shorted by an alpha particle, resulting in charge loss of Cb, and a soft error.

SUMMARY OF THE INVENTION

A single bit soft error in a DRAM chip is almost always a result of charge being lost on the storage capacitor of the memory cell, where this charge loss is caused by an ionizing particle passing through the junction associated with the capacitor. Therefore, if logic 1 represents charge on this capacitor and logic 0 represents no charge, then a single bit soft error occurs when a stored bit changes from logic 1 to logic 0, and not when a bit changes from logic 0 to logic 1.

The present invention corrects for soft errors automatically in a DRAM chip by storing redundantly a single bit in two memory cells, because it is highly unlikely that two cells will simultaneously have soft errors caused by charge loss in their storage capacitors. This invention describes circuitry to output a logic 1 if during cell readout either or both cells are storing a logic 1, and to output a logic 0 only if both cells are storing a logic 0.

In this invention every time a bit is read or refreshed any potential soft errors are corrected, by writing correct data into both memory cells associated with each bit. This invention has a negligible speed penalty for DRAM access time.

DETAILED DESCRIPTION OF THE INVENTION

Figure 1:
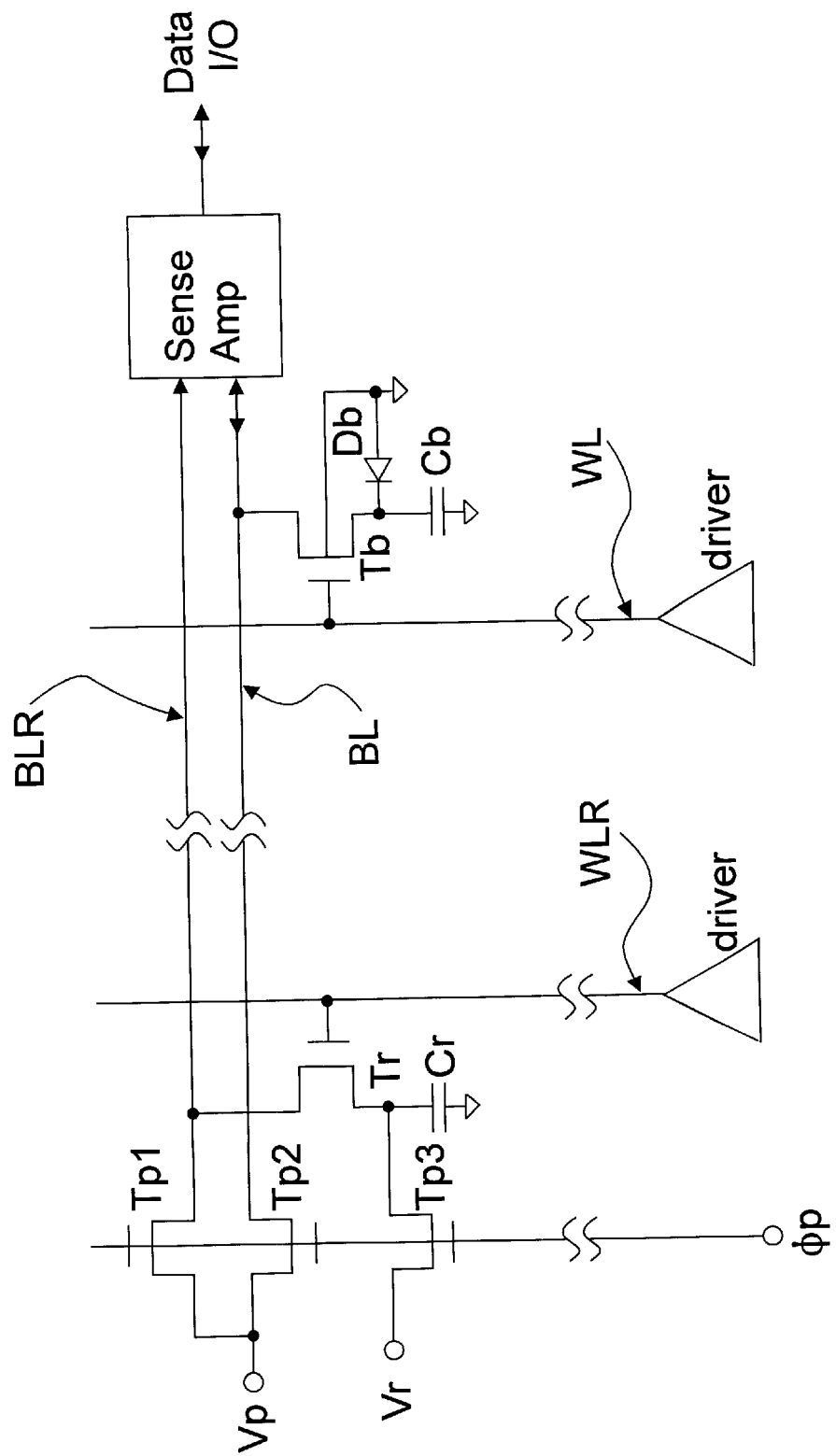
FIG. 1 is a simplified schematic of a conventional DRAM core.
Figure 2:
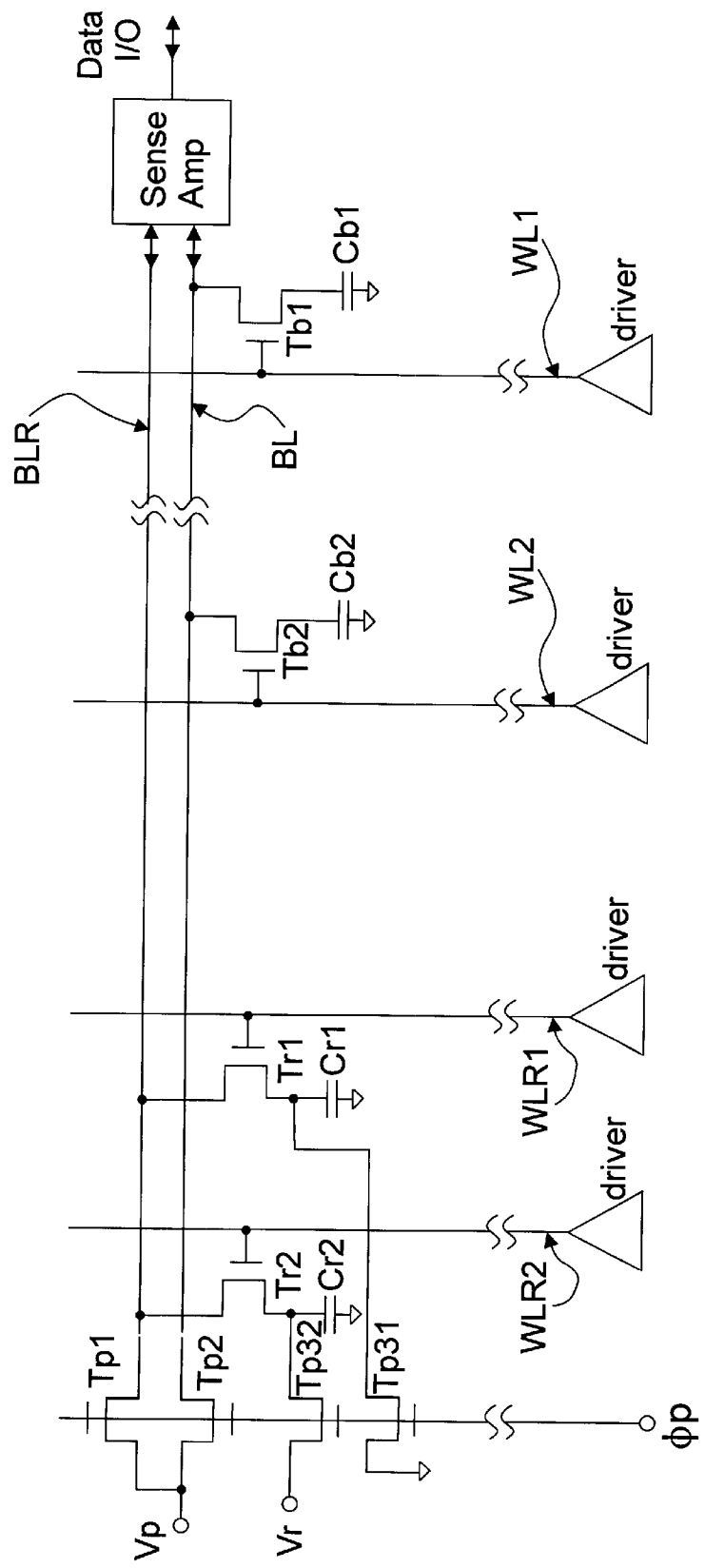
FIG. 2 is a simplified schematic of a Soft Error Immune DRAM core.

FIG. 2 shows a small portion of a preferred DRAM chip design for implementing this invention. Each memory bit is stored redundantly in two memory cells, where cell 1 is composed of capacitor Cb1 and access transistor Tb1, where cell 2 is composed of capacitor Cb2 and access transistor Tb2, and where these cells are both connected to bit line BL. Word lines WL1 and WL2 are designed to go high or low in synchronism, accessing cell 1 and cell 2 simultaneously. As in a conventional DRAM, there are two bit lines, a data bit line BL and a reference bit line BLR. A typical large DRAM chip will have thousands of word line pairs, and thousands of bit line pairs. To keep a bit line pair BL and BLR capacitively balanced, there are two reference cells connected to each reference bit line BLR. Reference cell 1 is composed of capacitor Cr1 and access transistor Tr1, and reference cell 2 is composed of capacitor Cr2 and access transistor Tr2. Word lines WLR1 and WLR2 are designed to go high or low in synchronism with each other and with WL1 and WL2, accessing reference cell 1 and reference cell 2 simultaneously, and where these reference cells are both connected to BLR. Transistors Tp1 and Tp2 precharge bit lines BL and BLR to Vp, as in a conventional DRAM. Transistors Tp31 and Tp32 precharge Cr1 and Cr2 to reference voltages ground and Vr when $\phi p$ goes high. A DRAM chip will have only one or a few reference word line pairs WLR1 and WLR2. In order to keep a balanced capacitance load on BL and BLR, all capacitors Cb1, Cb2, Cr1, and Cr2 are designed to be equal in value, say C, and transistors Tb1, Tb2, Tr1 and Tr2 are designed to be the same size. This will insure that the charge Q on any capacitor will be the same for a given voltage V according to the formula $Q=C \times V$.

Possible memory cycle cases will now be examined:

For the first case, assume that a logic I represented by a voltage Vp has been previously stored on both Cb1 and Cb2, and let Vr be set to, say Vp/4. During later reading of the charges on Cb1 and Cb2, first Cr1 will be precharged to 0 and Cr2 will be. precharged to Vp/4. After this precharge all the word lines will go high, and if after possible charge leakage, the voltages on Cb1 and Cb2 are each still greater than, say Vp/3, the charge Qb placed on WL will be more than the charge Qr placed on WLR, because $Qb>C \times Vp/3+C \times Vp/3)=2 \times C \times Vp/3$, whereas $Qr=(C \times 0+C \times Vp/4)=C \times Vp/4$. Therefore, the sense amplifier will properly detect that a logic 1 had been stored on Cb1 and Cb2, and will refresh a full Vp back into both Cb1 and Cb2.

For the second case, assume that a logic 0 represented by a voltage 0 has been previously stored on both Cb1 and Cb2, and again let Vr be set to Vp/4. During later reading of the charges on Cb1 and Cb2, first Cr1 will be precharged to 0 and Cr2 will be precharged to Vp/4. After this precharge all the word lines will go high, and the voltages on Cb1 and Cb2 will still be 0 so that the charge Qb placed on WL will be less than the charge Qr placed on WLR, because $Qb=(C \times 0+C \times 0)=0$, whereas $Qr=(C \times 0+C \times Vp/4)=C \times Vp/4$. Therefore, the sense amplifier will properly detect that a logic 0 had been stored on Cb1 and Cb2, and will refresh a 0 voltage back into both Cb1 and Cb2.

For the third case, assume that a logic 1 represented by a voltage Vp has been previously stored on both Cb1 and Cb2, and again let Vr be set to Vp/4. Next assume that either Cb1 or Cb2, or their access transistors, has an alpha particle hit reducing the charge on Cb1 or Cb2 to 0, before readout of their data. Then during later readout, when first Cr1 is precharged to 0 and Cr2 is precharged to Vp/4, and then when all the word lines go high, the voltage on either Cb1 or Cb2 not hit by the alpha particle is still greater than Vp/3, the charge Qb placed on WL will be more than the charge Qr placed on WLR, because $Qb>C \times 0+C \times Vp/3)=C \times Vp/3$, whereas $Qr=(C \times 0+C \times Vp/4)=C \times Vp/4$. Therefore, the sense amplifier will properly detect that a logic 1 had been stored on either Cb1 or Cb2, and will refresh a full Vp back into both Cb1 and Cb2.

It would be preferable to not let the word lines WL1 and WL2 be adjacent to each other, but to place them as far apart as practical. This will minimize the chance that an incident alpha particle can simultaneously destroy the charge on both capacitors making up a bit.

I claim:

1. A memory array of bits, wherein each bit is composed of two memory cells; and during the writing of data, each bit of the data is stored redundantly in the two memory cells, and wherein the stored data in each cell can be represented by a logic 1 or a logic 0; and during the reading of data, the combined data from both cells is used to determine whether the stored bit is a logic 1 or a logic 0.

2. The memory array of claim 1 wherein if both cells contain a logic 0 the stored bit is determined to be a logic 0, and if either or both cells contain a logic 1 the stored bit is determined to be a logic 1.

3. A dynamic random access memory (DRAM) array of bits wherein during writing each bit, the bit is stored redundantly in two memory cells, where each cell is composed of a storage capacitor and an access transistor, wherein these storage capacitors store data as a charge, with a logic 1 representing charge and logic 0 representing no charge; and during reading of a stored bit, the combined data from both cells is used to determine whether the stored bit is a logic 1 or a logic 0, and if both cells contain a logic 0 the stored bit is determined to be a logic 0, or if either or both cells contain a logic 1 the stored bit is determined to be a logic 1.

4. A dynamic random access memory (DRAM) array of bits wherein during writing each bit, the bit is stored redundantly in two memory cells, where each cell is composed of a storage capacitor and an access transistor, wherein these storage capacitors store data as a charge, with a logic 1 representing charge and logic 0 representing no charge; and during reading of a stored bit, the combined data from both cells is used to determine whether the stored bit is a logic 1 or a logic 0, and if both cells contain a logic 0 the stored bit is determined to be a logic 0, or if either or both cells contain a logic 1 the stored bit is determined to be a logic 1; and wherein simultaneously many stored bits are first read to determine whether the data of each bit is a logic 1 or a logic 0, and then both cells of each of these many stored bits are written simultaneously with the same data as the data that was read.

* * * * *